(12) United States Patent
Chang et al.

(10) Patent No.: US 10,685,871 B2
(45) Date of Patent: Jun. 16, 2020

(54) METHOD FOR FORMING SEMICONDUCTOR STRUCTURE

(71) Applicants: UNITED MICROELECTRONICS CORP., Hsin-Chu (TW); Fujian Jinhua Integrated Circuit Co., Ltd., Quanzhou, Fujian Province (CN)

(72) Inventors: Feng-Yi Chang, Tainan (TW); Fu-Che Lee, Taichung (TW)

(73) Assignees: UNITED MICROELECTRONICS CORP., Hsin-Chu (TW); Fujian Jinhua Integrated Circuit Co., Ltd., Quanzhou, Fujian Province (CN)

( * ) Notice: Subject to any disclaimer, the term of this patent is extended or adjusted under 35 U.S.C. 154(b) by 0 days.

(21) Appl. No.: 15/974,664

(22) Filed: May 8, 2018

(65) Prior Publication Data

US 2019/0080959 A1    Mar. 14, 2019

(30) Foreign Application Priority Data

Sep. 13, 2017    (CN) .......................... 2017 1 0821352

(51) Int. Cl.
*H01L 21/306* (2006.01)
*H01L 21/768* (2006.01)
*H01L 21/311* (2006.01)
*H01L 21/033* (2006.01)

(52) U.S. Cl.
CPC .... *H01L 21/76816* (2013.01); *H01L 21/0332* (2013.01); *H01L 21/0337* (2013.01); *H01L 21/31111* (2013.01); *H01L 21/31144* (2013.01); *H01L 21/7688* (2013.01)

(58) Field of Classification Search
CPC ........... H01L 21/0234; H01L 21/30604; H01L 21/3065; H01L 21/30655; H01L 21/31053; H01L 21/31055; H01L 21/311; H01L 21/31105; H01L 21/31111; H01L 21/31116; H01L 21/31127; H01L 21/31133; H01L 21/31138; H01L 21/3213; H01L 21/32133; H01L 21/32135; H01L 21/32136; H01L 21/47573
See application file for complete search history.

(56) References Cited

U.S. PATENT DOCUMENTS 5,952,246 A * 9/1999 Wang ................ H01L 21/31116
257/E21.252
6,458,516 B1    10/2002 Ye
7,888,267 B2    2/2011 Ko
(Continued)

*Primary Examiner* — Thomas T Pham
(74) *Attorney, Agent, or Firm* — Winston Hsu

(57) ABSTRACT

The present invention provides a method for fabricating a semiconductor structure. A multilayer structure on is formed a substrate, the multilayer structure includes at least a first dielectric layer, a second dielectric layer and an amorphous silicon layer, next, a first etching step is performed, to forma first recess in the amorphous silicon layer and in the second dielectric layer, parts of the first dielectric layer is exposed by the first recess, afterwards, a hard mask layer is formed in the first recess, a second etching step is then performed to remove the hard mask layer and to expose a surface of the first dielectric layer, and a third etching step is performed with the remaining hard mask layer, to remove a portion of the first dielectric layer, so as to form a second recess in the first dielectric layer.

13 Claims, 12 Drawing Sheets

(56) References Cited

U.S. PATENT DOCUMENTS

| | | | |
|---|---|---|---|
| 9,620,544 B2 | 4/2017 | Chung | |
| 9,627,469 B2 | 4/2017 | Yi | |
| 2007/0049032 A1* | 3/2007 | Abatchev | H01L 21/0337 438/691 |
| 2008/0017992 A1 | 1/2008 | Kito | |
| 2009/0176344 A1* | 7/2009 | Lo | H01L 29/4983 438/303 |
| 2014/0308761 A1* | 10/2014 | Kuo | H01L 21/3086 438/5 |
| 2015/0179748 A1* | 6/2015 | Chang | H01L 29/66833 438/591 |

* cited by examiner

METHOD FOR FORMING SEMICONDUCTOR STRUCTURE

BACKGROUND OF THE INVENTION

1. Field of the Invention

The present invention relates to the field of semiconductor processing, and in particular, to a method for adjusting the width of a contact hole to prevent the contact hole from being over-etched.

2. Description of the Prior Art

In the semiconductor manufacturing process, a photolithography process is an indispensable technique, which mainly forms a designed pattern such as a circuit pattern, an implanted area layout pattern, and a contact hole unit pattern, or a plurality of photomasks, and then transferring the pattern on the photomask to a photoresist layer on a substrate by exposing and developing steps, thereby precisely transferring the complex layout pattern to a thin film layer on or in a semiconductor wafer. Then, with the subsequent corresponding ion implantation process or etching process, a complicated circuit structure can be completed.

However, when the pattern is transferred to a multilayer structure composed of different materials, the etching process may be difficult due to different etching rates of the materials, and in severe cases, over-etching of the material of a specific layer may be caused, thereby affecting the transfer of the pattern.

SUMMARY OF THE INVENTION

The present invention provides a method for fabricating a semiconductor structure, comprising: firstly, a multilayer structure on is formed a substrate, the multilayer structure includes at least a first dielectric layer, a second dielectric layer on the first dielectric layer, and an amorphous silicon layer on the second dielectric layer; next, a first etching step is performed to remove a portion of the amorphous silicon layer and a portion of the second dielectric layer, to form a first recess in the amorphous silicon layer and in the second dielectric layer, wherein parts of the first dielectric layer is exposed by the first recess, afterwards, a hard mask layer is formed in the first recess, wherein the hard mask layer covers the first dielectric layer completely, a second etching step is then performed to remove the hard mask layer and to expose a surface of the first dielectric layer again, and a third etching step is performed with the remaining hard mask layer, to remove a portion of the first dielectric layer, so as to form a second recess in the first dielectric layer.

One of the features of the present invention is to avoid the over etching issue caused by excessive etching rate of a specific layer (e.g., the first dielectric layer) during different etching rates. Therefore, a hard mask layer is additional formed on the sidewall of the layer above one specific layer (for example, the second dielectric layer). The hard mask layer itself has a certain thickness, so that the over-etched portion of the underlying first dielectric layer can be compensated. In addition, by adjusting the thickness of the hard mask layer and other etching parameters, the width of the recess can be further controlled and the process yield can be improved.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
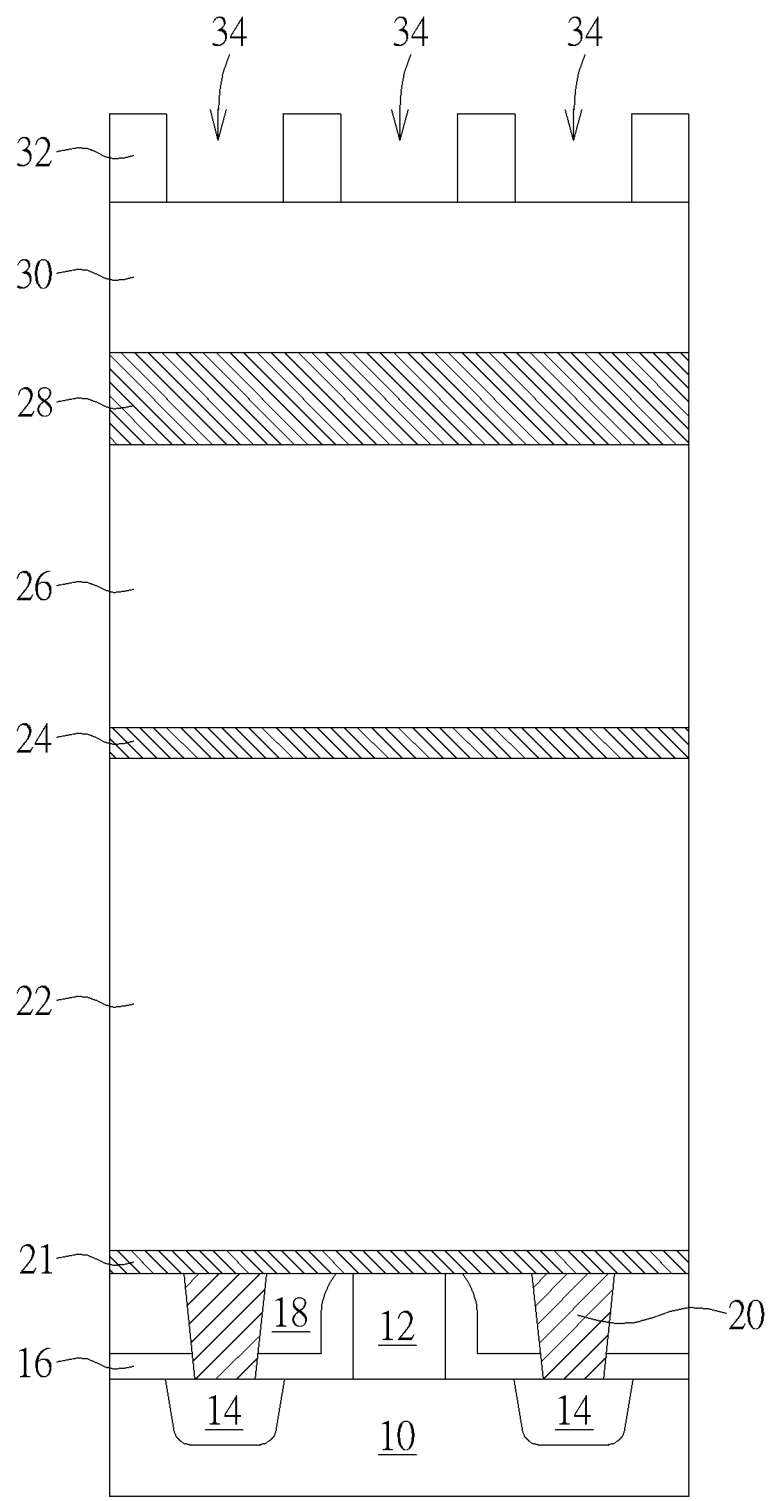
FIG. 1, FIG. 2, FIG. 3B, and FIG. 4 to FIG. 7 illustrate schematic diagrams of fabricating a semiconductor structure according to a first preferred embodiment of the present invention.

Please refer to FIG. 1, FIG. 2, FIG. 3B, and FIG. 4 to FIG. 7, which are schematic cross-sectional views of a semiconductor device according to a first preferred embodiment of the present invention. As shown in FIG. 1, a substrate 10 is provided, such as a silicon substrate, a silicon-containing substrate, a III-V group silicon-based substrate (e.g., GaN-on-silicon), a graphene-based substrate or a silicon-on-insulator (SOI) substrate, on which at least one semiconductor device is formed, for example, a metal oxide semiconductor (MOS) transistor, and the MOS transistor has a gate structure 12 and a plurality of source/drain regions 14 are locating in the substrate 10 and disposed on two sides of the gate structure 12. Thereafter, a contact etch stop layer (CESL) 16 and a dielectric layer, such as an bottom interlayer dielectric (ILD) 18, are sequentially formed on the substrate 10, and then a planarization step, such as chemical mechanical polishing (CMP), is performed to remove the extra bottom ILD 18 and to exposes the gate structure 12. The gate structure 12 may be a metal gate or a polysilicon gate or the like, but not limited thereto. In this embodiment, contact structures 20 may be selectively formed on the S/D region 14 and in the CESL 16 and in the bottom ILD 18. The contact structure 20 can be a pole contact or a slot contact and directly contacts the source/drain region 14. In the example, the contact structure 20 includes a material having high conductivity, such as tungsten, but is not limited thereto.

A multilayer structure is formed on the bottom ILD 18, and in this embodiment, the multilayer structure sequentially includes, from bottom to top, a material layer 21, a boron-phosphorous silicon glass layer 22, a material layer 24, a first dielectric layer 26, a second dielectric layer 28, an amorphous silicon layer 30 and a patterned hard mask layer 32.

The material layer 21, the material layer 24 and the second dielectric layer 28 are preferably a silicon carbonitride layer, and the first dielectric layer 26 and the patterned hard mask layer 32 preferably comprise silicon oxide layer, but are not limited thereto. Each layer material and its adjacent other material layers preferably have etching selectivity, in other words, for the same etching step, etching one specific material layer and etching the other adjacent layer material layers have different etching rates.

The patterned hard mask layer 32 includes a plurality of recesses 34. Each recess 34 is located corresponding to the lower gate structure 12 or the contact structure 20. For example, a method for forming the patterned hard mask layer 32 includes: forming a hard mask layer (not shown) on the amorphous silicon layer 30, and forming one or more photoresist structures covering the hard mask layer. Taking the present embodiment as an example, three photoresist structures can be formed, each of which includes an organic dielectric layer (ODL), a silicon-containing hard mask bottom anti-reflective coating (SHB), and a photoresist layer. The SHB layer is composed of an organ silicon polymer or polysilane, and the photoresist layer such as an ArF photoresist layer, which is suitable for exposure to a light source with a wavelength of 193 nm. Then, a photolithography step is used to pattern the three photoresist layers, and the pattern of the three photoresist layers is transferred to the hard mask layer by an etching step, to form a patterned hard mask layer 32.

Figure 2:
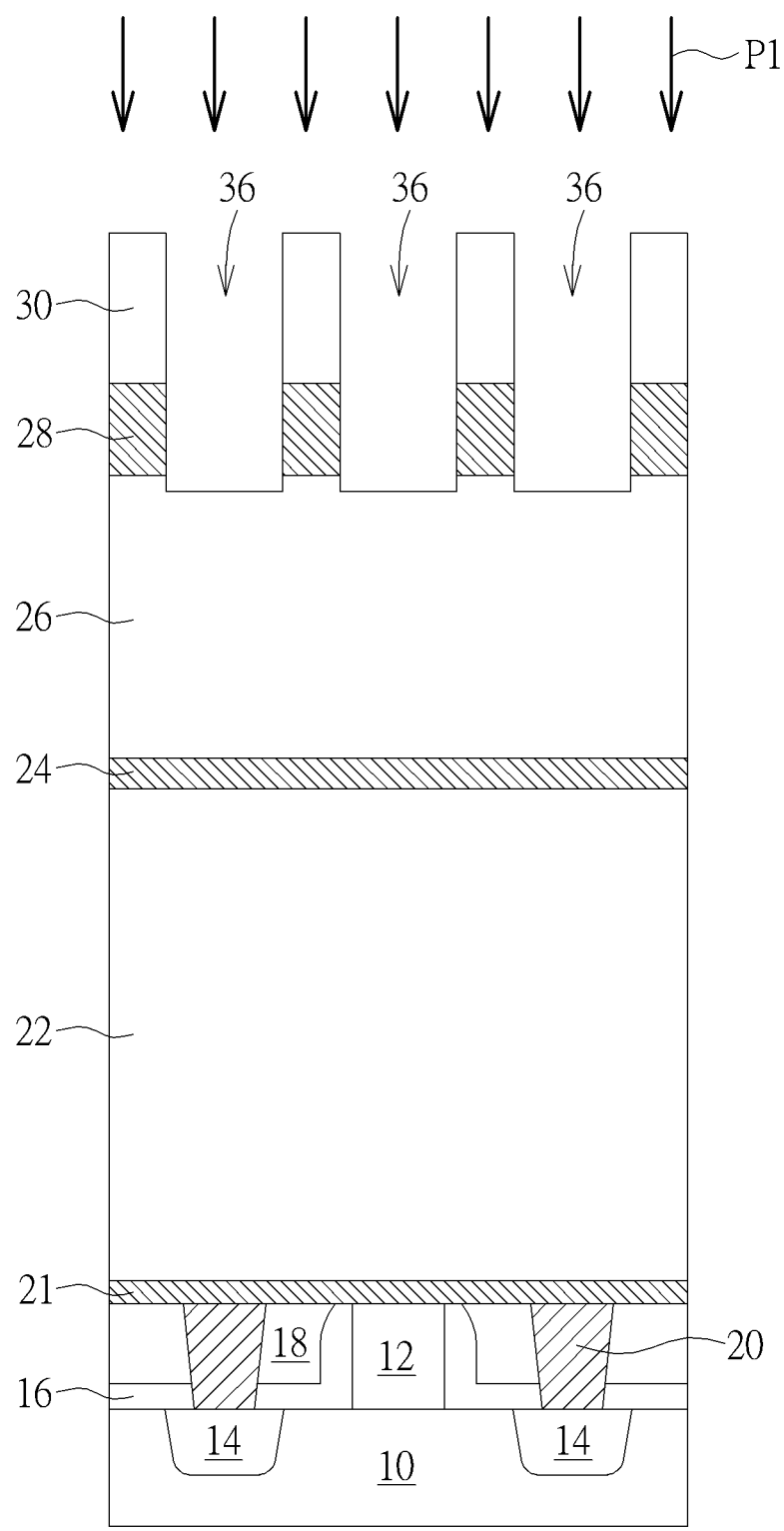

As shown in FIG. 2, a first etching step P1 is performed to transfer the pattern of the patterned hard mask layer 32 to the lower amorphous silicon layer 30 and the second dielectric layer 28, to form a plurality of first recesses 36. The first etching step P1 may include one or more etching steps. In this embodiment, the first etching step P1 includes two steps of removing a portion of the amorphous silicon layer 30 and a portion of the second dielectric layer 28 respectively. The step of removing a portion of the amorphous silicon layer 30 includes etching the amorphous silicon layer 30 with a chlorine gas and a hydrogen bromide gas. The step of removing a portion of the second dielectric layer 28 includes etching the dielectric layer 28 with a fluorine-containing gas. However, the parameters of the etching step described above are only one example of the present invention, other suitable etching methods should also be within the scope of the present invention. In addition, after the first etching step P1 is performed, the top surface of the first dielectric layer 26 is exposed by the first recess 36.

Figure 3A:
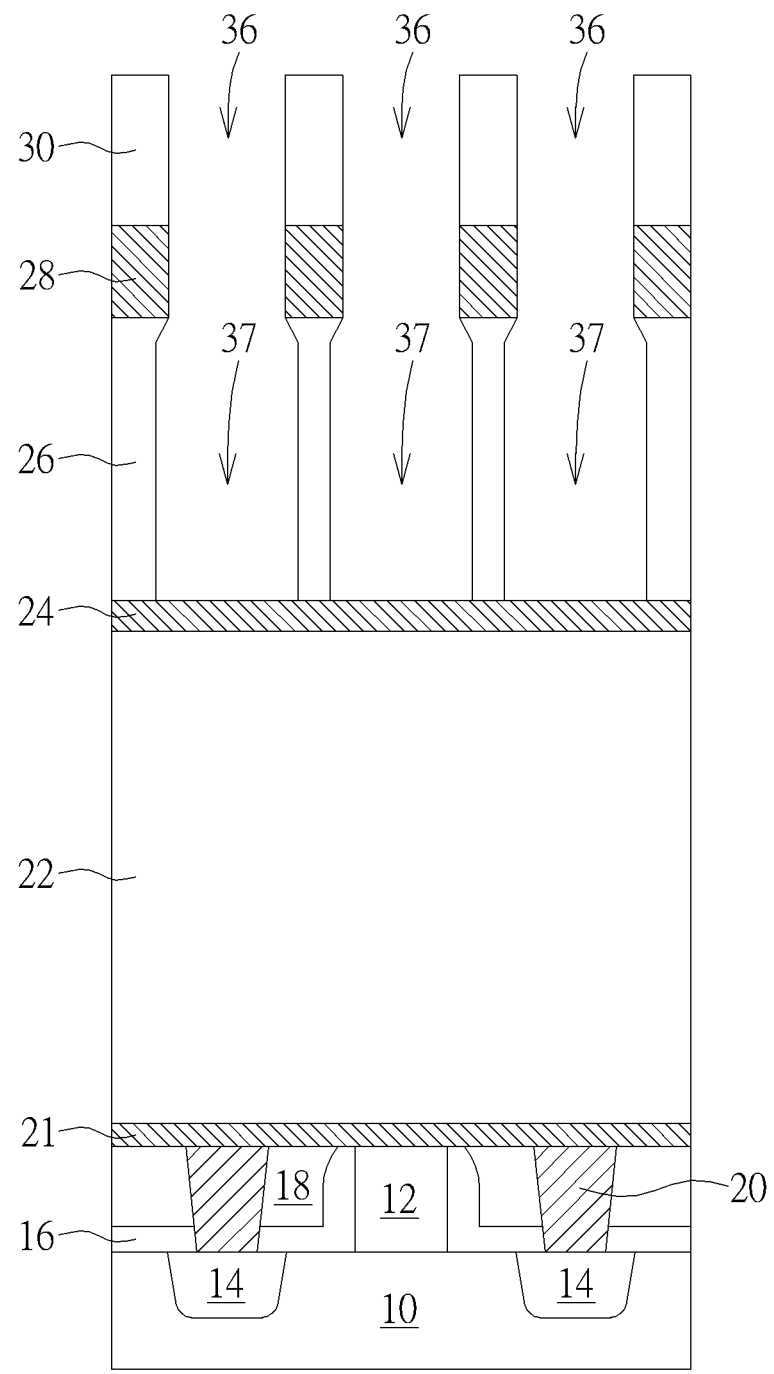
FIG. 3A is a schematic view of a semiconductor structure according to another embodiment of the present invention.

FIG. 3A shows a schematic diagram of forming a semiconductor structure according to one embodiment of the present invention. Applicants have founded that if an etching step is performed directly at this step, the pattern of the first recess 36 is continuously transferred to the underlying first dielectric layer 26, and a plurality of recesses 37 are then formed. Since the material of the first dielectric layer 26 is, for example, silicon oxide, compared to other material layers (for example, compared to silicon carbonitride), the etching rate is faster. Therefore, as shown in FIG. 3A, since the first dielectric layer 26 is etched too quickly, it is over-etched to cause a pull-out phenomenon, which means that the width of the recess 37 formed in the first dielectric layer 26 is larger than the width of the original first recess 36. According to this process, the width of the bottom of the contact hole may be enlarged, and the size of the contact structure may be changed. In some cases, the contact structure may touch other components, causing the short circuit issue.

Figure 3B:
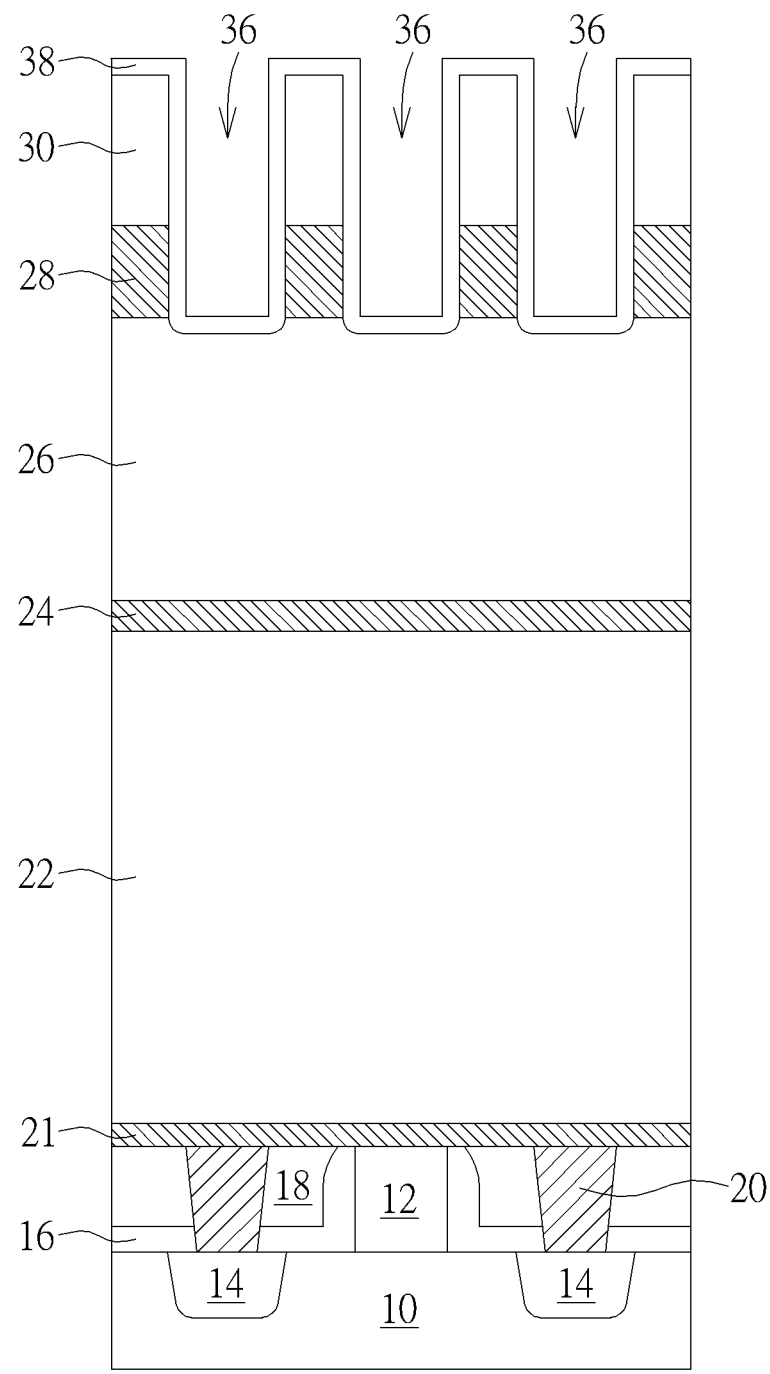

In order to avoid the above issue, as shown in FIG. 3B, FIG. 3B shows a schematic diagram of forming a semiconductor structure according to another embodiment of the present invention. Before the etching step is continued to transfer the pattern to the first dielectric layer 26A, a hard mask layer 38 is additional formed, for example, using chemical vapor deposition (CVD) or the like to form the hard mask layer 38, and the hard mask layer 38 completely covers the bottom and sidewalls of the first recess 36. The material of the hard mask layer 38 includes a metal nitride, such as titanium nitride or tantalum nitride. The thickness of the hard mask layer 38 is, for example, from 30 angstroms to 150 angstroms, but can be adjusted according to actual requirements.

Figure 4:
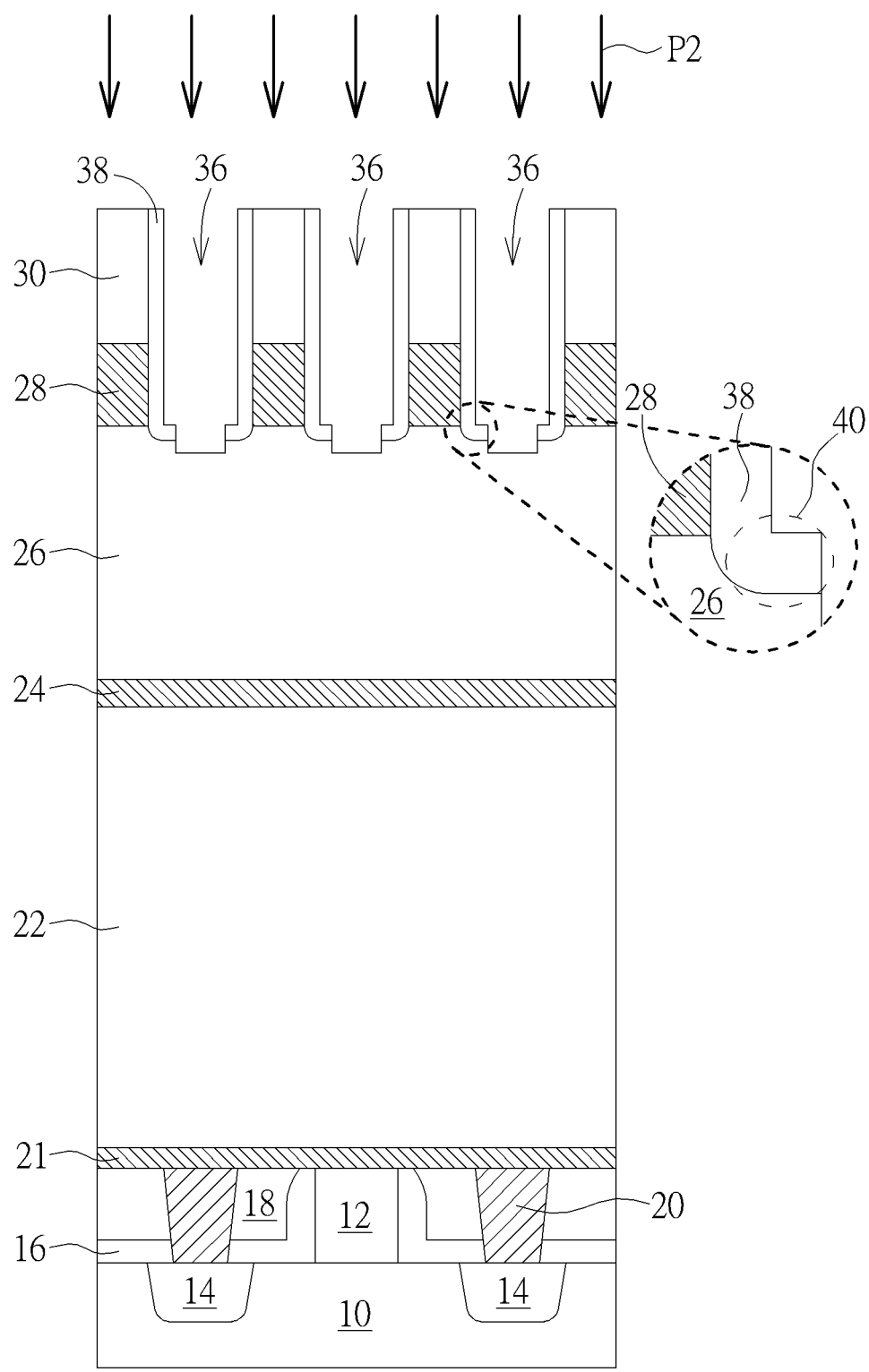

FIGS. 4-8 are schematic diagrams of a semiconductor structure in which the process is continued while continuing the structure shown in FIG. 3B. As shown in FIG. 4, a second etching step P2 is performed to remove part of the hard mask layer 38. It should be noted that the second etching step P2 is a vertical anisotropic etching step, for example, including partially etching the hard mask layer 38 with a chlorine gas. Therefore, after the second etching step P2 is performed, the hard mask layer 38 at the bottom of the first recess 36 is partially removed, to expose the top of the portion of the first dielectric layer 26, but the hard mask layer 38 at the bottom of the first recess 36 still exists, that is, the hard mask layer 38 at the bottom of the first recess 36 is not completely removed, and the remaining hard mask layer 38 includes a protrusion 40. The hard mask layer 38 and the protrusion 40 together constitute an "L-shaped" section structure. However, the present invention is not limited thereto. In some embodiments, the protrusions 40 may not be included, so the remaining hard mask layer 38 on the sidewalls of the first recess 36 has a vertical cross-sectional structure.

Figure 5:
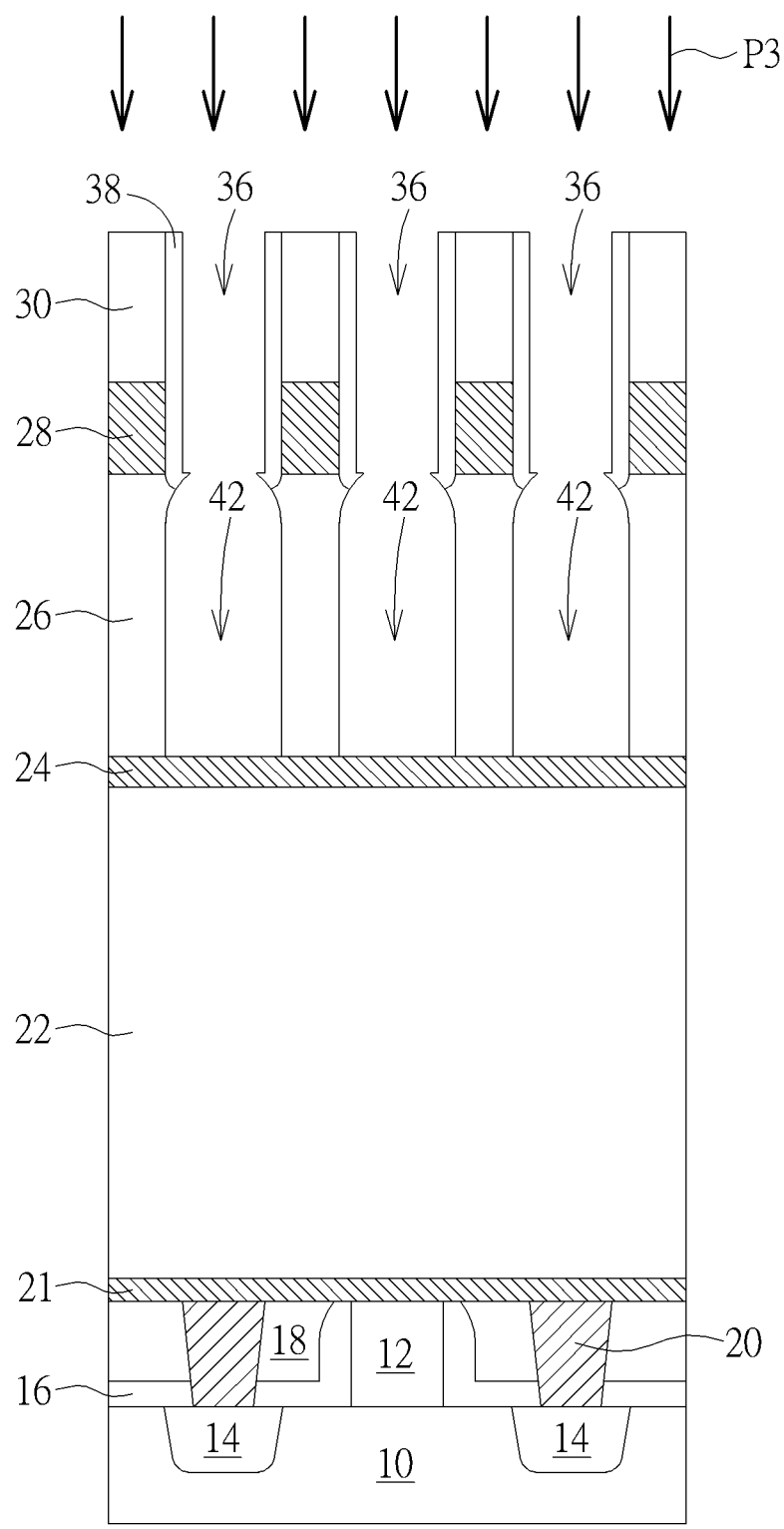

Then, as shown in FIG. 5, using the remaining hard mask layer 38 (possibly adding the protruding portion 40) as the hard mask layer, a third etching step P3 is performed to etch the first dielectric layer 26, and a second recess 42 is formed in the first dielectric layer 26. As described above, since the first dielectric layer 26 is etched at a faster rate, it may still cause over-etching issues. However, since the hard mask layer 38 is additionally formed in the present embodiment, the hard mask layer 38 itself has a thickness, and has the protruding portion 40, so that part of the first dielectric layer 26 can be blocked. In other words, a portion of the first dielectric layer 26 is blocked by the hard mask layer 38 and the protrusion 40, so the subsequently formed second recess 42 has a smaller opening. During the third etching step P3, the portion of the first dielectric layer 26 blocked by the hard mask layer 38 and the protruding portion 40 compensates the portion of the first dielectric layer 26 that is over-etched. Therefore, even if the first dielectric layer 26 is over-etched, the width of the formed second recess 42 is not larger than the width of the first recess 36. In the present embodiment, the width of the first recess 36 is still greater than the width of the second recess 42. As a result, the above short-circuit phenomenon can be avoided. In addition, in other preferred embodiments of the present invention, by adjusting the thickness of the hard mask layer 38, the width of the second recess 42 may be equal to the width of the first recess 36, so that it will be more favorable for subsequent filling a conductive layer into the recess.

Figure 6:
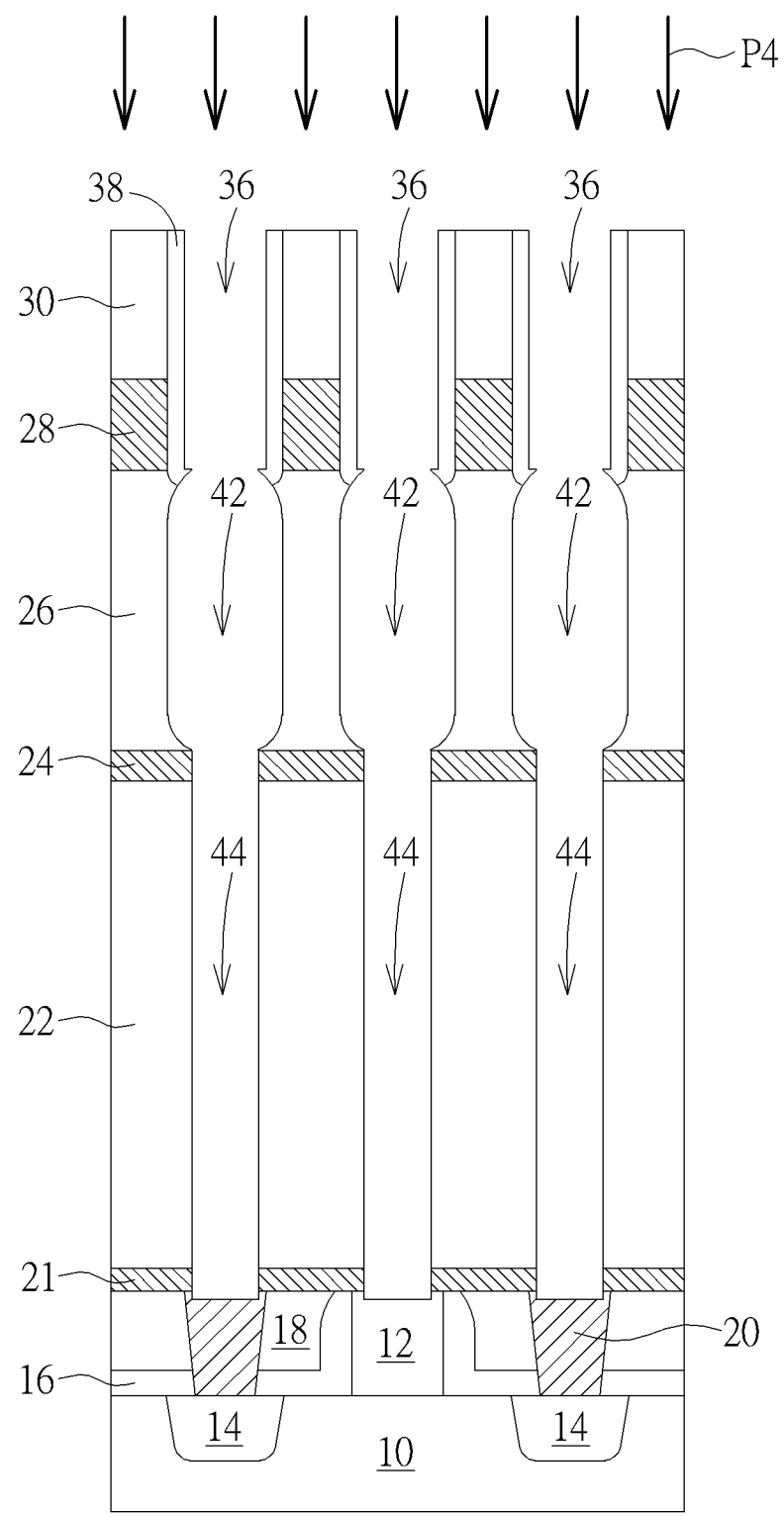

Then, as shown in FIG. 6, a fourth etching step P4 is performed to transfer the pattern of the second recess 42 into the underlying material layer 24, the BPSG layer 22 and the material layer 21. Preferably, the fourth etching step P4 also includes multiple etching steps, to remove the material layer 24, the BPSG layer 22 and material layer 21 respectively. A plurality of third recesses 44 are formed at the same time, and the third recesses 44 expose the top surface of the underlying gate structure 12 or the top surface of the contact structure 20.

Figure 7:
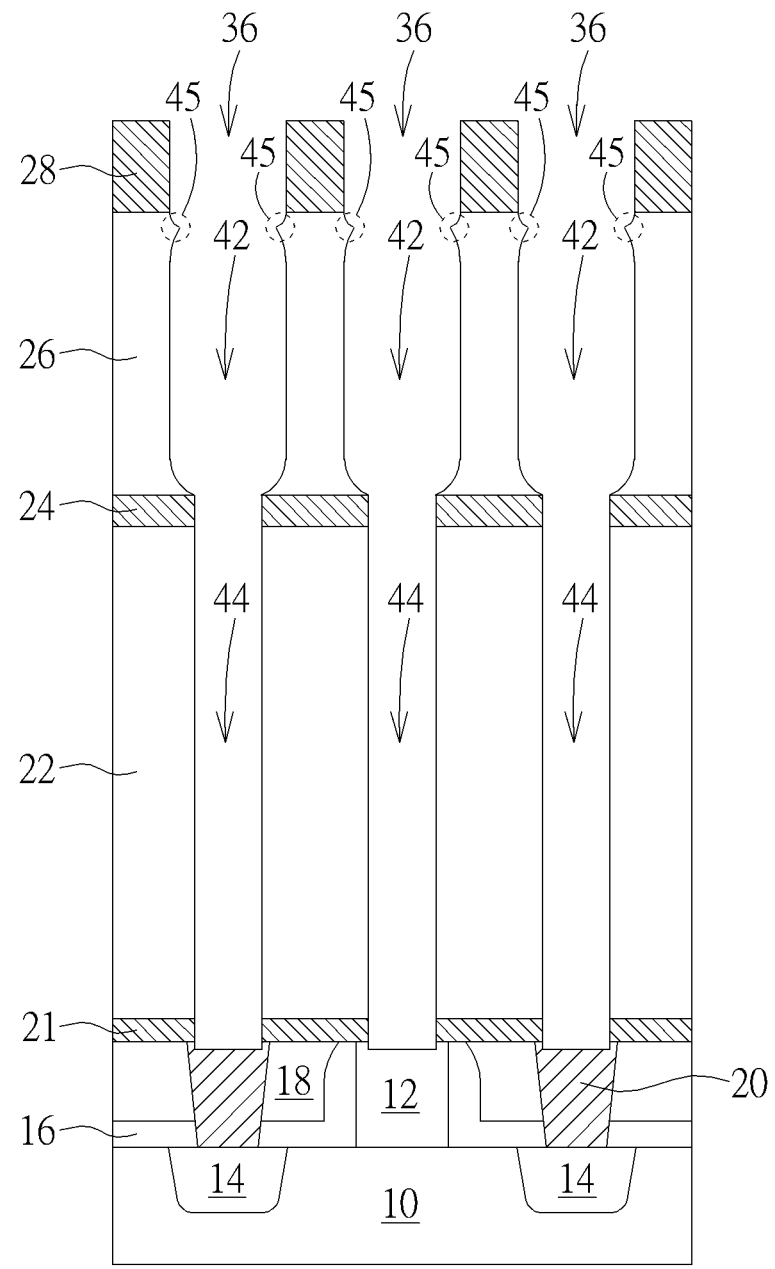
Figure 8:
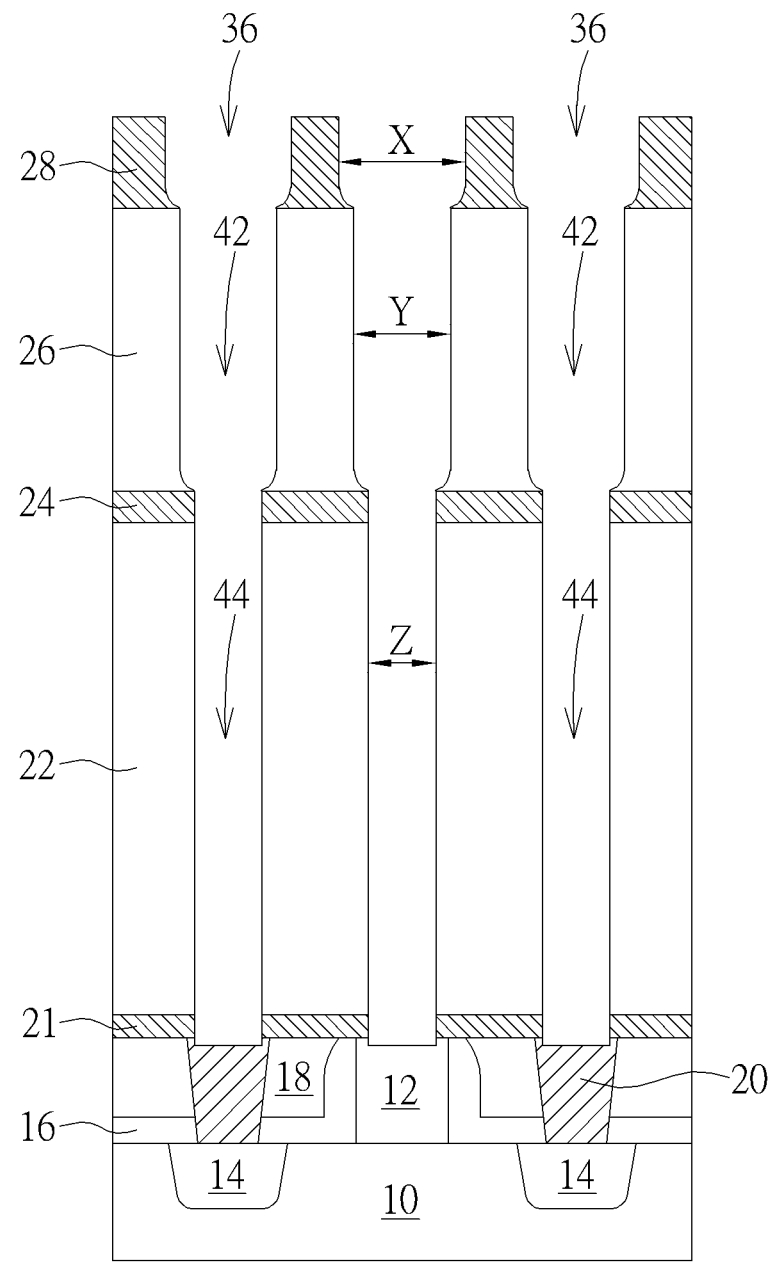
FIG. 8 to FIG. 11 respectively show schematic diagrams of semiconductor structures produced by different embodiments of the present invention.
Figure 9:
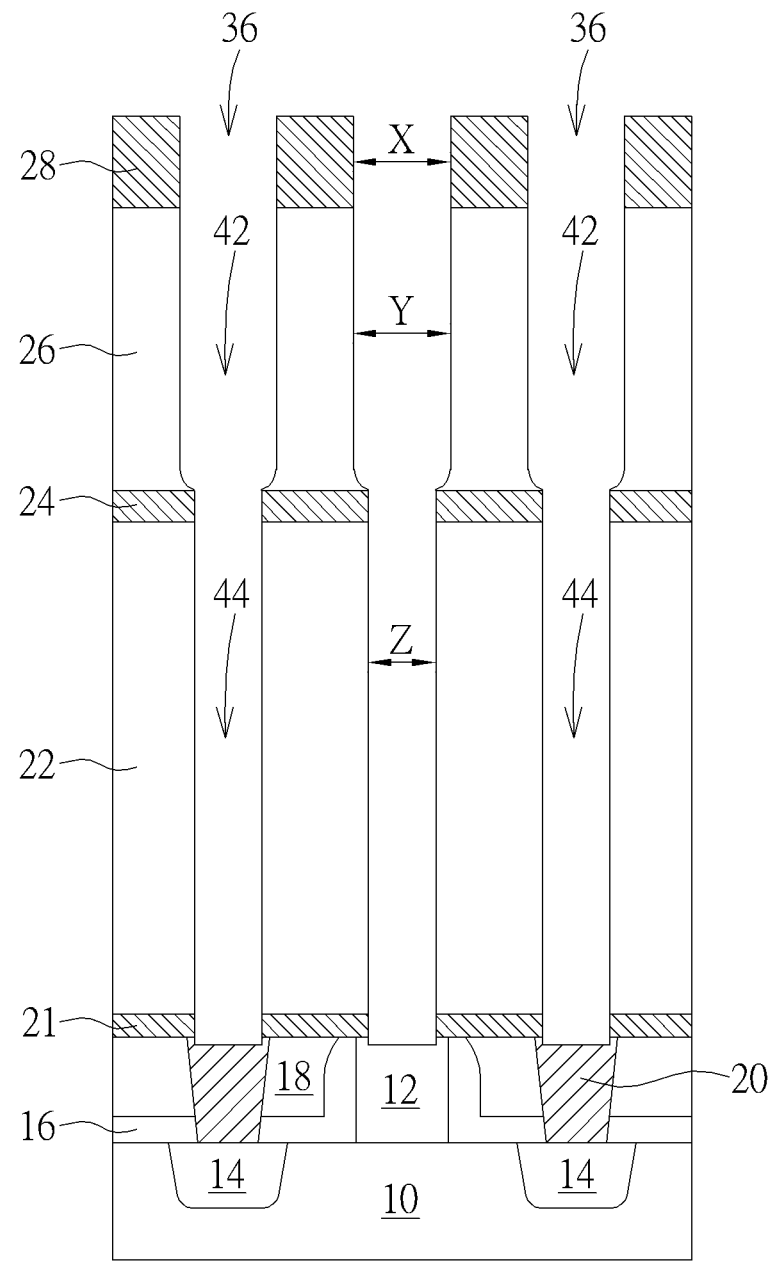
Figure 10:
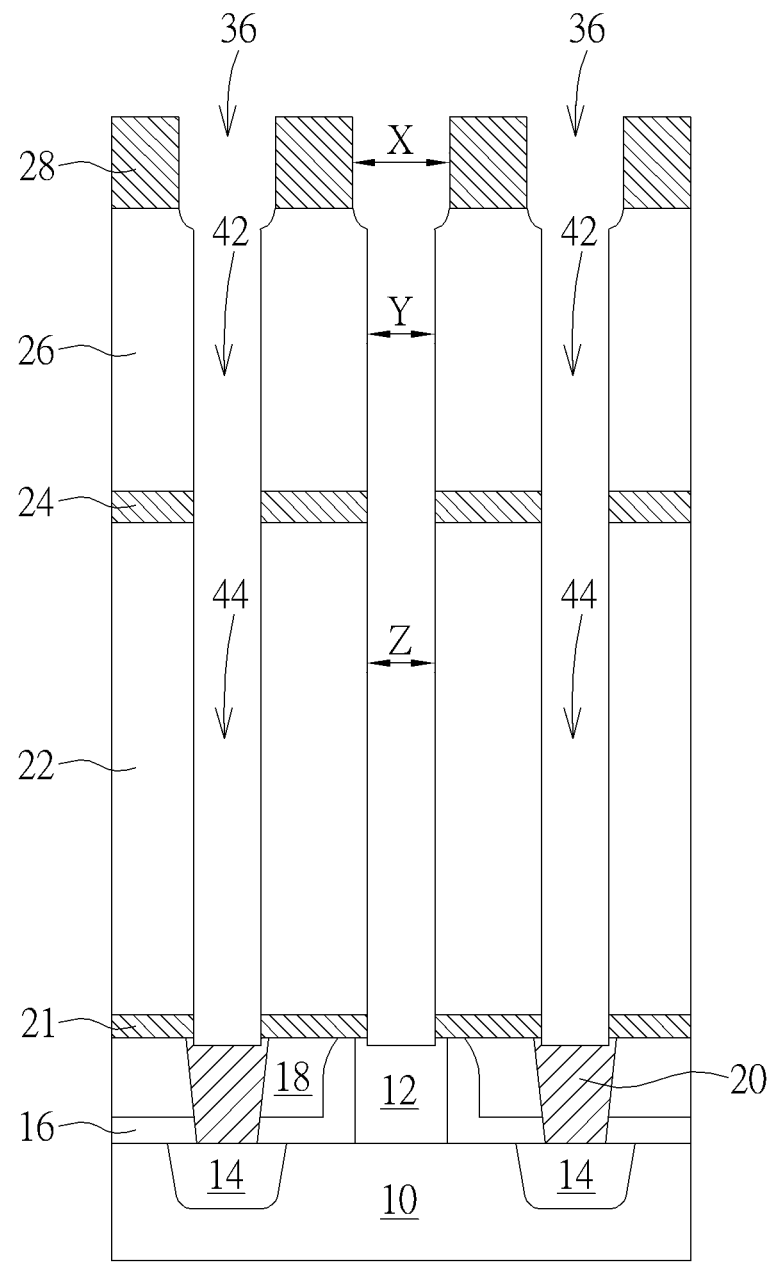
Figure 11:
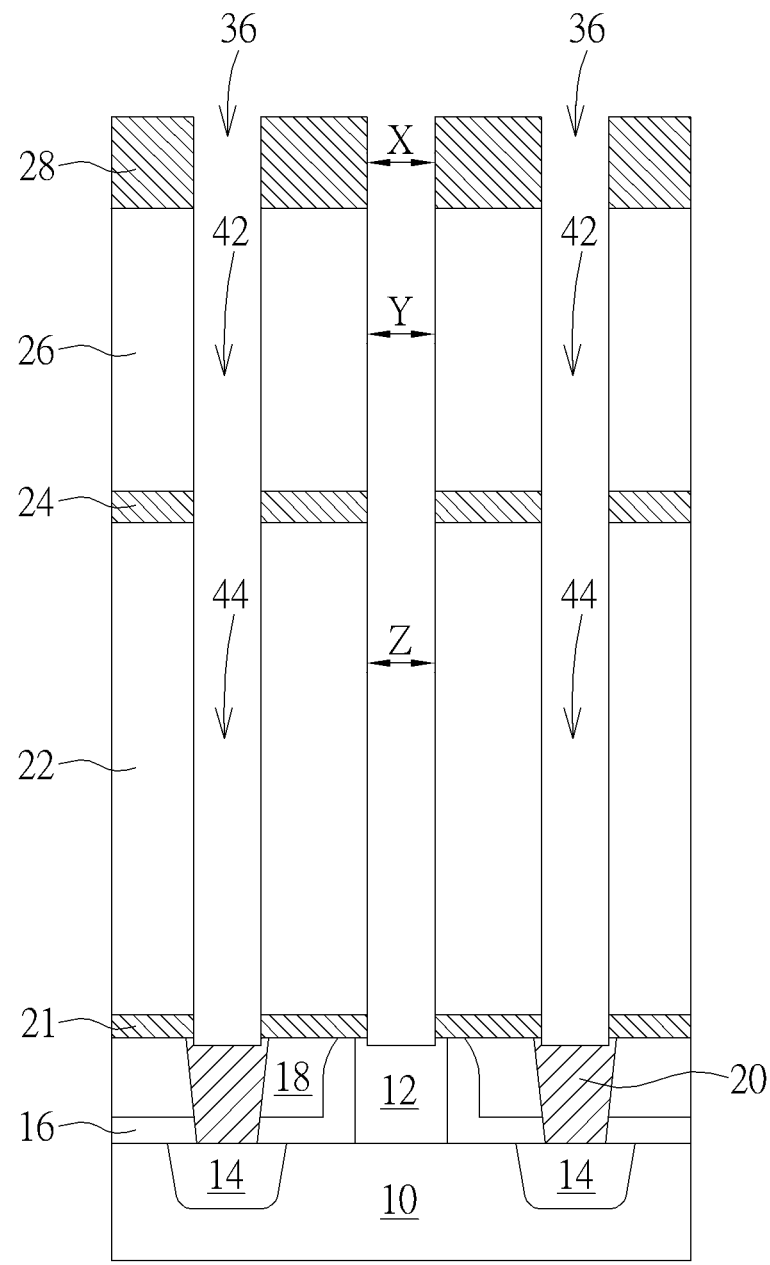

It should be noted that in the present embodiment, after the fourth etching step P4 is performed, part of the hard mask layer 38 is still disposed on the sidewall of the second dielectric layer 28. Therefore, as shown in FIG. 7, one or more etching steps are performed to completely remove the amorphous silicon layer 30, the second dielectric layer 28, and the hard mask layer 38. Also in this etching step, the amorphous silicon layer 30 may also be removed together, but it is not limited thereto. In addition, if the aforementioned hard mask layer 38 includes the protrusion 40 (L-shaped cross-sectional structure), a protrusion 45 may be remained on the sidewall of the first dielectric layer 26 after the hard mask layer 38 is removed.

In the subsequent steps, a conductive layer (not shown), such as tungsten, may be filled in each recess (including the first recess 36, the second recess 42 and the third recess 44), and the recesses are filled with the conductive layer to form a plurality of contact structure on the original contact structure 20. Until this step, the semiconductor structure of the present invention having a contact structure is completed.

FIG. 8 to FIG. 11 are schematic views of semiconductor structures according to different embodiments of the present invention. As shown in FIGS. 8 to 11, after the completion of the third recess 44, the width of the first recess 36 is defined as X, the width of the second recess 42 is defined as Y, and the width of the third recess is defined as Z. By changing the thickness of the hard mask layer and etching parameters, the relationship between the widths X, Y, and Z can be adjusted. For example, in FIG. 8, the width X is greater than the width Y and greater than the width Z; in FIG. 9, the width X is equal to the width Y and greater than the width Z; in FIG. 10, the width X is greater than the width Y, and the width Y is equal to the width Z; in FIG. 11, the width X, Y, Z are equal to each other. The embodiments of the various width variations described above all fall within the scope of the present invention.

In summary, one of the features of the present invention is to avoid the over etching issue caused by excessive etching rate of a specific layer (e.g., the first dielectric layer) during different etching rates. Therefore, a hard mask layer is additional formed on the sidewall of the layer above one specific layer (for example, the second dielectric layer). The hard mask layer itself has a certain thickness, so that the over-etched portion of the underlying first dielectric layer can be compensated. In addition, by adjusting the thickness of the hard mask layer and other etching parameters, the width of the recess can be further controlled and the process yield can be improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a semiconductor structure, comprising:
   providing a multilayer structure on a substrate, the multilayer structure comprising at least a first dielectric layer, a second dielectric layer on the first dielectric layer, and an amorphous silicon layer on the second dielectric layer;
   forming a boron-phosphorous silicon glass (BPSG) layer under the first dielectric layer, and a contact structure under the boron-phosphorous silicon glass layer;
   performing a first etching step to remove a portion of the amorphous silicon layer and a portion of the second dielectric layer, to form a first recess in the amorphous silicon layer and in the second dielectric layer, wherein parts of the first dielectric layer is exposed by the first recess;
   forming a hard mask layer in the first recess, wherein the hard mask layer covers the first dielectric layer completely;
   performing a second etching step to remove the hard mask layer and to expose a surface of the first dielectric layer again; and
   performing a third etching step with the remaining hard mask layer, to remove a portion of the first dielectric layer, so as to form a second recess in the first dielectric layer.

2. The method of claim 1, wherein the first recess has a first inner diameter width, the second recess has a second inner diameter width, and the first inner diameter width is greater than the second inner diameter width.

3. The method of claim 1, wherein the first recess has a first inner diameter width, the second recess has a second inner diameter width, and the first inner diameter width is equal to the second inner diameter width.

4. The method of claim 1, wherein the first dielectric layer is an oxide layer.

5. The method of claim 1, wherein the second dielectric layer is a silicon carbonitride layer.

6. The method of claim 1, further comprising performing a fourth etching step after the third etching step is performed, to form a third recess in the BPSG layer, and the third recess exposes the contact structure.

7. The method of claim 1, wherein the contact structure at least comprises a tungsten conductive layer.

8. The method of claim 1, wherein after the fourth etching step is performed, a portion of the hard mask layer still exists on the side of the second dielectric layer.

9. The method of claim 1, wherein the material of the hard mask layer includes a metal nitride layer.

10. The method of claim 9, wherein the step of removing a portion of the hard mask layer includes etching the hard mask layer with a chlorine gas.

11. The method of claim 1, wherein the step of removing a portion of the amorphous silicon layer includes etching the amorphous silicon layer with a chlorine gas and a hydrogen bromide gas.

12. The method of claim 1, wherein the step of removing a portion of the second dielectric layer includes etching the second dielectric layer with a fluorine-containing gas.

13. The method of claim 1, wherein the remaining hard mask layer includes a protrusion after the second etching step is performed, and the remaining hard mask layer has an L-shaped cross-sectional structure.

* * * * *